(12) United States Patent
Bailey et al.

(10) Patent No.: US 7,397,262 B2
(45) Date of Patent: Jul. 8, 2008

(54) BURN-IN SYSTEM POWER STAGE

(75) Inventors: Philip Alan Bailey, Marine on St. Croix, MN (US); Kevin Roland Deters, Coon Rapids, MN (US)

(73) Assignee: Micro Control Company, Fridley, MN (US)

( * ) Notice: Subject to any disclaimer, the term of this patent is extended or adjusted under 35 U.S.C. 154(b) by 0 days.

(21) Appl. No.: 11/602,093

(22) Filed: Nov. 20, 2006

(65) Prior Publication Data

US 2008/0116860 A1 May 22, 2008

(51) Int. Cl.
*G01R 31/26* (2006.01)
(52) U.S. Cl. ................... 324/765; 323/234; 323/243
(58) Field of Classification Search ................. None
See application file for complete search history.

(56) References Cited

U.S. PATENT DOCUMENTS

| | | | | |
|---|---|---|---|---|
| 3,529,230 | A * | 9/1970 | Tedd | 340/636.16 |
| 4,035,715 | A * | 7/1977 | Wyman et al. | 323/268 |
| 4,924,170 | A * | 5/1990 | Henze | 323/272 |
| 6,414,470 | B1 * | 7/2002 | Liu et al. | 323/272 |
| 6,435,547 | B2 * | 8/2002 | Igawa | 280/731 |
| 6,693,806 | B2 * | 2/2004 | Uchida | 363/50 |
| 6,727,745 | B2 * | 4/2004 | Shearon et al. | 327/541 |
| 6,756,807 | B2 * | 6/2004 | Johnson et al. | 324/771 |
| 6,956,391 | B2 * | 10/2005 | Kamitani | 324/760 |
| 7,141,955 | B1 * | 11/2006 | Martinez | 323/272 |

* cited by examiner

*Primary Examiner*—Ha Nguyen
*Assistant Examiner*—Richard Isla-Rodas
(74) *Attorney, Agent, or Firm*—Westman, Champlin & Kelly, P.A.

(57) ABSTRACT

A burn-in system includes a testing stage configured to stress test one an integrated circuit and a power stage having a voltage control mode and a current control mode. The power stage is configured to supply power to the testing stage. One embodiment of the power stage includes a pulse width modulator, a current control circuit and a voltage control circuit. The pulse width modulator is configured to generate a modulated power output that is coupled to the testing stage. The current control circuit is configured to produce a current error output signal that is based on a difference between a measured load current, which is indicative of the current that is supplied to the testing stage by the modulated power output, and target load current. The voltage control circuit is configured to produce a voltage error output signal that is based on a difference between a measured load voltage, which is indicative of the voltage across a load of the testing stage, and a target load voltage when the power stage is in the voltage control mode. The voltage control circuit is further configured to produce the voltage error output signal that is based on the current error output signal when the power stage is in the current control mode. The modulated power output is based on the voltage error output signal.

19 Claims, 6 Drawing Sheets

BURN-IN SYSTEM POWER STAGE

FIELD OF THE INVENTION

Embodiments of the present invention generally relate to "burn-in" systems that stress test electronic components. More particularly, embodiments of the present invention relate to a power stage configured to supply power to a testing stage of the burn-in system where the stress testing of electronic components, such as integrated circuit chips, is conducted. Additional embodiments relate to a method of controlling the power supplied to the testing stage.

BACKGROUND OF THE INVENTION

Electronic components, such as silicon integrated circuit chips or other electronic components, are subject to early failure during their life cycle. It is desirable to detect and eliminate the chips that are most prone to early failure prior to sending them to market. Additionally, it is desirable to identify the components of the chips that cause the early failures so that they may be improved. Thus, producers of these electronic components have found it cost-effective to utilize burn-in systems to rigorously temperature stress the integrated circuit chips while simultaneously powering them in order to detect under-performing chips.

Figure 1:
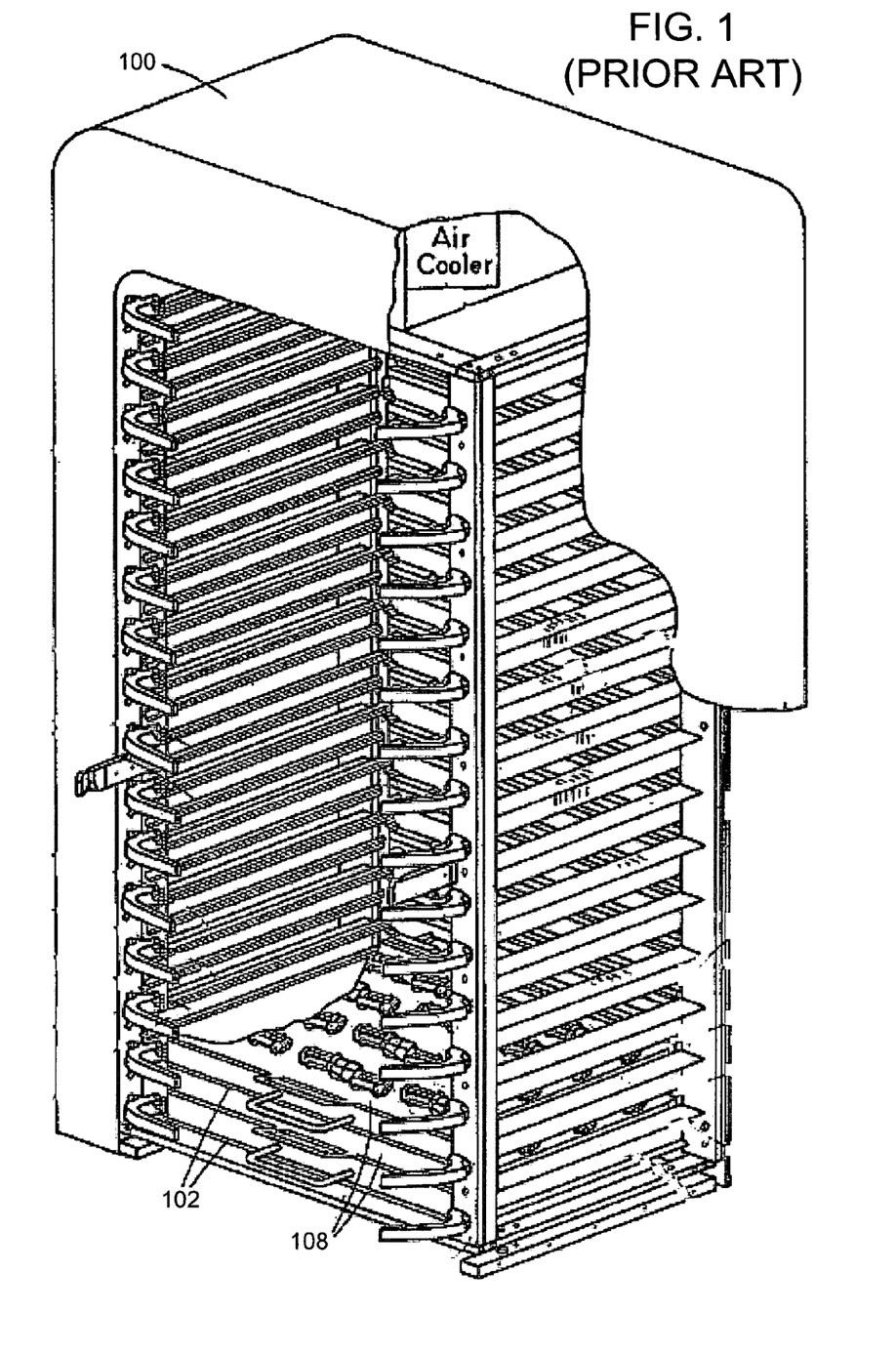
FIG. 1 is a perspective view of an exemplary burn-in oven with a portion of the housing removed to show a plurality of burn-in boards, in accordance with the prior art.

Burn-in systems typically utilize burn-in boards to support a number of electronic components to be tested inside a burn-in oven. An exemplary burn-in oven 100, shown in FIG. 1, is typically configured to hold several racks of burn-in boards 102. Each burn-in board 102 typically includes multiple sockets 104 for holding integrated circuit chips or electronic devices 106 (hereinafter "chips") that are to be stress tested, as illustrated in the schematic diagram of a burn-in system provided in FIG. 2.

Figure 2:
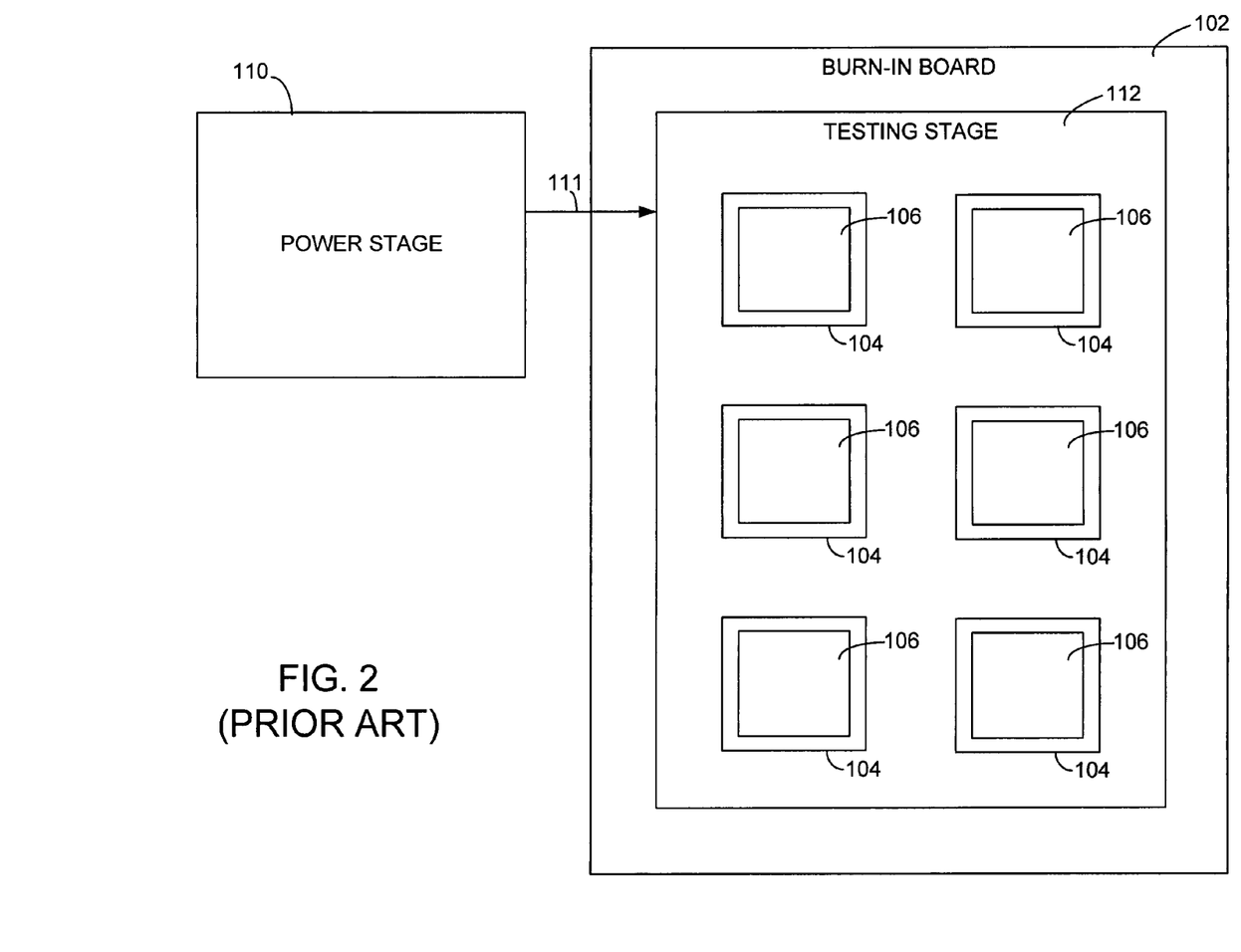
FIGS. 2 and 3 are schematic diagrams of a burn-in system in accordance with the prior art.

The chips 106 on the burn-in board 102 are powered and exposed to heat stress over an extended period of time. During burn-in temperature stressing of the chips, heat exchange systems 108 are employed to maintain the chips within a desired temperature range to prevent overheating of the chips, which can damage properly functioning chips.

Burn-in systems also include a power stage 110 to supply a desired power 111 to a testing stage 112 of the burn-in board 102, as illustrated in FIG. 2. The testing stage 112 handles the application of the power 111 supplied from the power stage 110 to the integrated circuit chips 106 being tested. Multiple power stages can be used to simultaneously supply power to the testing stage when the amount of power supplied by a single power stage is insufficient.

Figure 3:
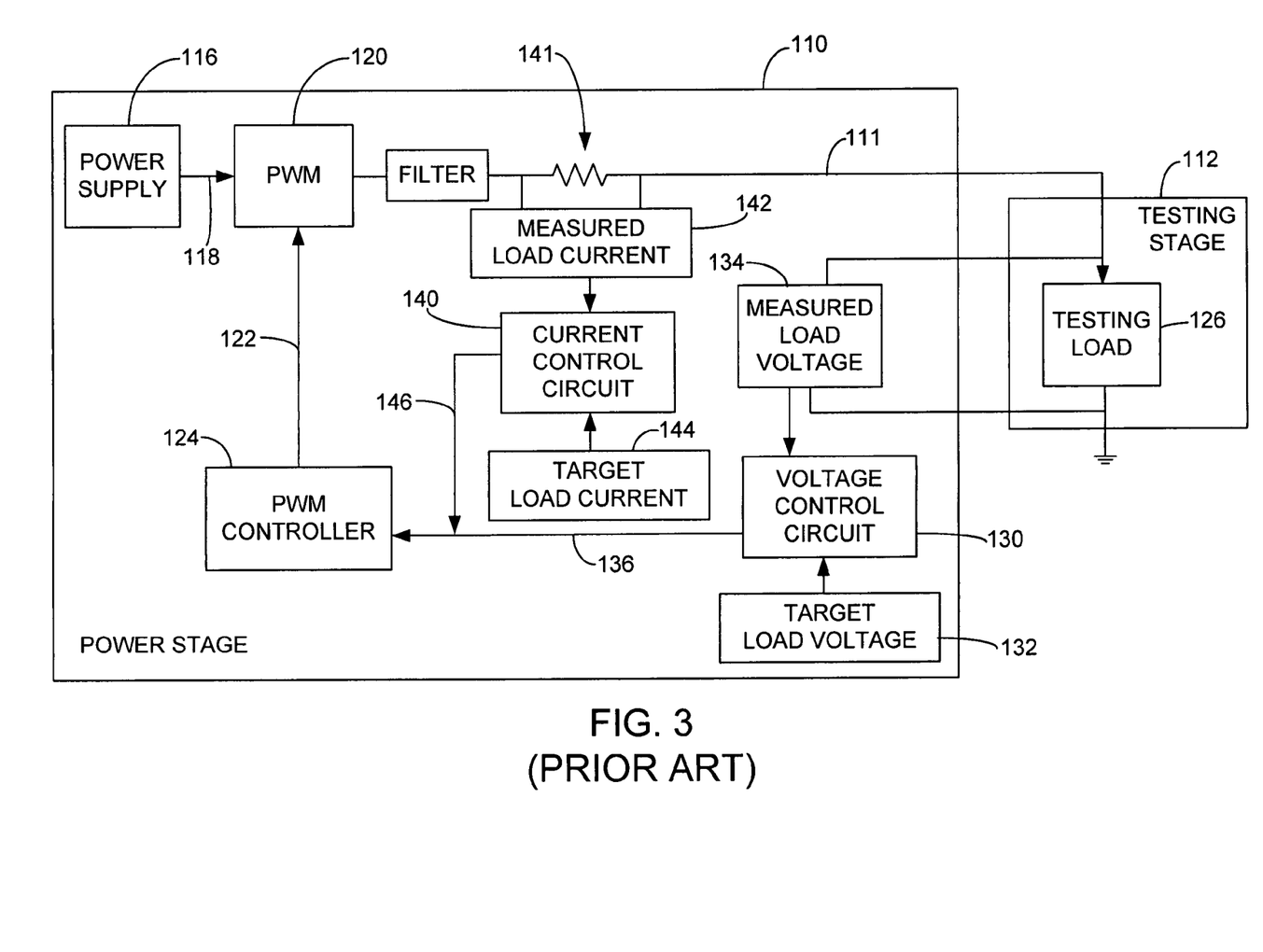

An exemplary power stage 110 in accordance with the prior art is illustrated schematically in FIG. 3. The power stage 110 includes one or more power supplies 116 that provide bulk power 118 for the power stage 110. A pulse width modulator (PWM) 120 modulates the bulk power 118 in response to a control signal 122 from a pulse width modulator controller 124 to control the power that is supplied to the testing stage 112.

It is important to control the voltage across the chips 106, or the electrical testing "load" 126 of the testing stage 112, during stress testing to ensure that the specifications of the test being conducted are met. For example, if the voltage across the testing load 126 is not in accordance with the specifications of the test, the testing results will be unreliable. Unfortunately, the task of maintaining the voltage across the load 126 at a desired level is made difficult by the fact that the load 126 will vary due to temperature changes in the chips and other factors over the course of a stress test.

Voltage control circuits, such as voltage control circuit 130 shown in FIG. 3, have been used to ensure that the desired voltage, or target load voltage 132, is applied across the load 126 of the testing stage 112 during chip stress testing. The voltage control circuit 130 generally operates by measuring the voltage across the load 126 of the testing stage 112 and comparing that measured load voltage 134 to the target load voltage 132. The difference between the measured load voltage 134 and the target load voltage 132 indicates an error, which is fed from the voltage control circuit 130 to the pulse width modulator controller 124 as a voltage error signal 136. The pulse width modulator controller 124 generates the control signal 122, based on the voltage error signal 136, that controls the pulse width modulator 120 to adjust the power 111 supplied to the power stage 112 as needed to change the measured load voltage 134 to the target load voltage 132. In this manner the voltage across the testing load 126 is maintained at the desired level.

The stress testing of high performance integrated circuit chips typically requires the application of high power to the resultant load 126 of the testing stage 112. This high power demand places a heavy demand on the power supply 116 of the power stage 110. In particular, as the load 126 of the testing stage 112 increases, the current supplied to the testing stage 112 from the power stage 110 must increase in order to maintain the desired target load voltage 132 across the testing load 126. Occasionally, the demand for current exceeds the capability of the power supply 116. In order to avoid damaging the power supply 116, various protection methods have been employed.

One protection method incorporated by prior art burn-in systems shuts down the pulse width modulator controller 124 and thus the pulse width modulators 120 when a current limit of the measured load current 142 is exceeded. Unfortunately, this protection method results in undesired interruptions to the stress testing of the chips.

In an effort to avoid interrupting ongoing chip stress testing, power protection has been provided to power stages 110 using a current control circuit 140 (FIG. 3) that operates discretely from the voltage control circuit 130 described above to prevent the current output from the power stage 110 to the testing stage 112 from exceeding preset current limits. The current control circuit 140 operates in a manner that is similar to the voltage control circuit 130 by measuring the current fed to the load 126 of the testing stage 112 with a current shunt 141, comparing this measured load current 142 to a target load current 144 and outputting a current error signal 146 that is related to the difference between the measured load current 142 and the target load current 144. The current error signal 146 produced by the current control circuit 140 is coupled to the voltage error signal 136.

When the power stage 110 provides a current to the testing stage that is less than the target load current 144, the power stage 110 operates in a "voltage control" mode, in which the control signal 122 to the pulse width modulator 120 is substantially independent of the current error signal 146 and substantially dependent on the voltage error signal 136. In other words, the control signal 122 received by the pulse width modulator 120 is substantially based on the difference between the measured load voltage 134 and the target load voltage 132.

However, when the power stage 110 provides a current (i.e., measured load current 142) to the testing stage 112 that exceeds the target load current 144, the power stage 110 switches from the voltage control mode to a "current control" mode, in which the control signal 122 received by the pulse width modulator 120 is substantially independent of the voltage error signal 136 and substantially dependent on the current error signal 146. In other words, the control signal 122 received by the pulse width modulator 120 is substantially based on the difference between the measured load current 142 and the target load current 144. While in the current control mode, the current output from the power stage 110 is reduced to a value that is equal to the target load current 144 regardless of the target and measured load voltages 132 and 134.

One problem with the arrangement depicted in FIG. 3 is that the switching between the voltage control mode and the current control mode produces a transient error in the signal to the pulse width modulator controller 124 for a period of time before it settles to a stable and useable signal. As a result, there is a delay in the switching between the voltage and current control modes. This delay limits the high power testing capability of the burn-in system because the target or maximum load current level 144 must be reduced in order to ensure that the current limit of the power stage 110 is not exceeded.

Additionally, the modulated power output 111 produced by the power stage 110 typically comprises an errant voltage during transitions between the voltage and current control modes, which can affect the accuracy of the testing.

There is a continuous demand for improvements to burn-in systems including more seamless switching between current and voltage control modes of the power stage.

Embodiments of the present invention provide solutions to these and other problems, and offer other advantages.

SUMMARY OF THE INVENTION

The present invention is directed to a burn-in system that includes a testing stage configured to stress test one an integrated circuit and a power stage having a voltage control mode and a current control mode. The power stage is configured to supply power to the testing stage. One embodiment of the power stage includes a pulse width modulator, a current control circuit and a voltage control circuit. The pulse width modulator is configured to generate a modulated power output that is coupled to the testing stage. The current control circuit is configured to produce a current error output signal that is based on a difference between a measured load current, which is indicative of the current that is supplied to the testing stage by the modulated power output, and target load current. The voltage control circuit is configured to produce a voltage error output signal that is based on a difference between a measured load voltage, which is indicative of the voltage across a load of the testing stage, and a target load voltage when the power stage is in the voltage control mode. The voltage control circuit is further configured to produce the voltage error output signal that is based on the current error output signal when the power stage is in the current control mode. The modulated power output is based on the voltage error output signal.

Another embodiment of the invention is directed to a method of controlling power supplied to a testing stage of a burn-in system. In the method, a modulated power output from a pulse width modulator is provided to a load of the testing stage. Measured and target load currents and measured and target load voltages are received. The measured load current is indicative of a current supplied to the testing stage by the modulated power output. The measured load voltage is indicative of a voltage across the load. A current error output signal is produced based on a difference between the measured load current and the target load current. A control signal is generated with a pulse width modulator controller. The control signal is based on the measured load voltage and the target load voltage when the measured load current is less than the target load current. The control signal is based on the current error signal when the measured load current is greater than the target load current. The modulated power output is controlled based on the control signal.

Other features and benefits that characterize embodiments of the present invention will be apparent upon reading the following detailed description and review of the associated drawings.

DETAILED DESCRIPTION OF ILLUSTRATIVE EMBODIMENTS

Embodiments of the present are directed to a burn-in system power stage that is configured to produce a power output that powers a testing stage for stress testing integrated circuit chips or electronic devices. Additional embodiments relate to a method of controlling power supplied to an integrated circuit testing stage of a burn-in system.

Figure 4:
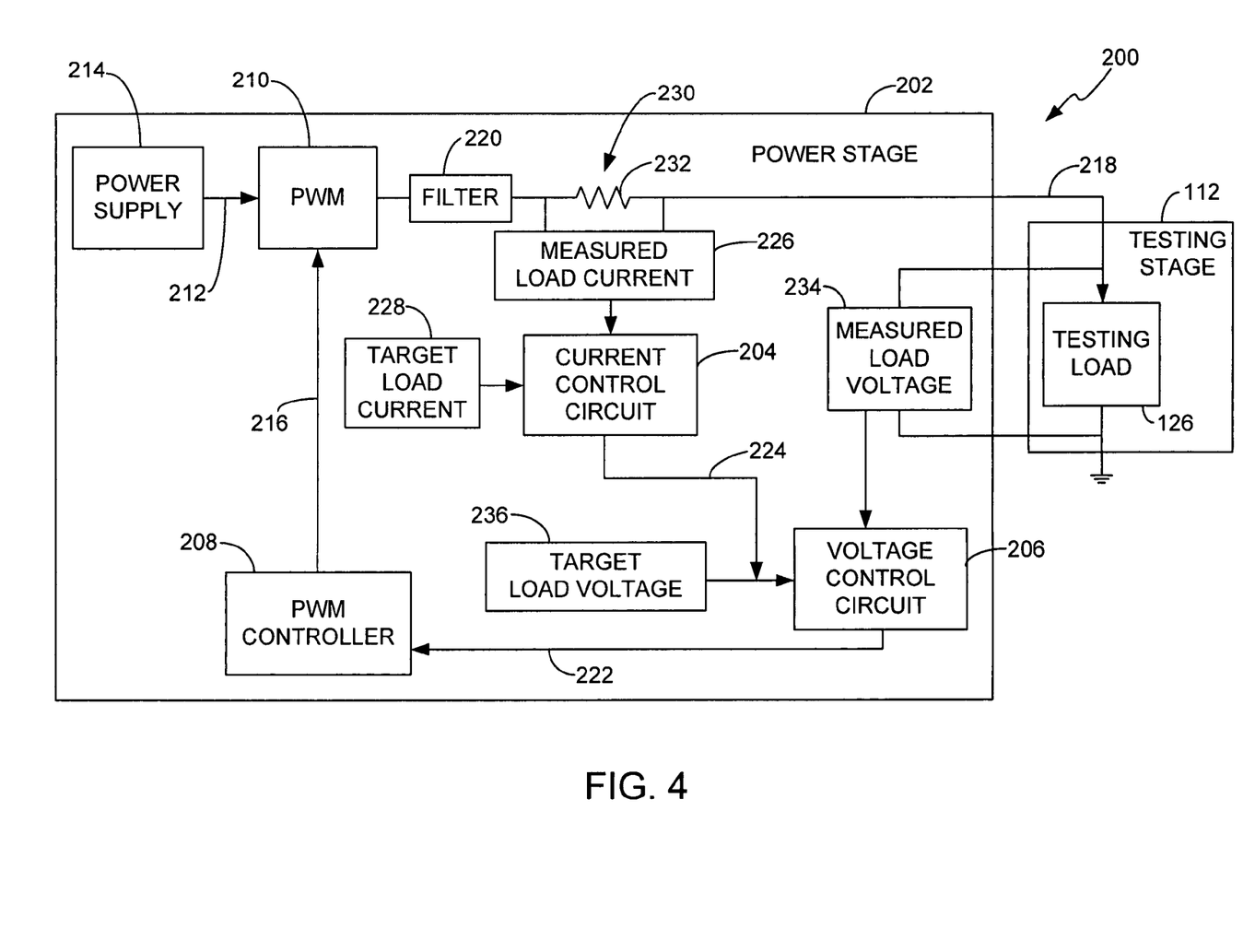
FIG. 4 is a schematic diagram of a burn-in system in accordance with embodiments of the invention.

FIG. 4 is a schematic diagram of a burn-in system 200 that includes the testing stage 112 described above and a power stage 202 in accordance with embodiments of the invention that provides power to the testing stage 112. It is understood by those skilled in the art that the power stage depicted in FIG. 4 can be a sub-stage of a larger power stage of the burn-in system in which the power outputs are coupled together to provide more power to the testing stage.

Embodiments of the power stage 202 include a current control circuit 204, a voltage control circuit 206, a pulse width modulator (PWM) controller 208, and a pulse width modulator 210. The pulse width modulator 210 modulates a bulk power output 212 from a power supply 214 based on a control signal 216 generated by the pulse width modulator controller 208 to produce a modulated power output 218. In general, the bulk power output 212 is modulated in accordance with a duty cycle that is set by the control signal 216 from the pulse width modulator controller 208 to form the modulated power output 218. A filter 220 can be used to convert the modulated power output 218 into the direct current form generally used by the testing stage 112.

An exemplary pulse width modulator controller 208 that is suitable for use in the power stage 202 is the LTC3731 controller manufactured by Linear Technology Corporation. The LTC3731 includes an internal error voltage amplifier and protection circuitry. These are disabled by connecting the appropriate input (i.e., EAIN input) to an appropriate voltage so that there is a single control input to the pulse width modulator controller 208.

As discussed above with reference to FIG. 3, conventional burn-in system power stages generate the modulated power output based on either the voltage error output signal 136 (when the power stage is in the voltage control mode) or the current error output signal 146 (when the power stage is in the current control mode). Embodiments of the invention include the generation of the control signal 216 by the pulse width modulator controller 208 based on a voltage error output signal 222 from the voltage control circuit 206 during both voltage and current control modes of operation of the power stage 202. As a result, embodiments of the invention include the generation of the modulated power output 218 by the pulse width modulator 210 based on the voltage error output signal 222 during both voltage and current control modes of operation of the power stage 202.

One embodiment of current control circuit 204 is configured to produce a current error output signal 224 that is based on a difference between a measured load current 226 and target load current 228. The measured load current 226 is indicative of the current that is being supplied to the testing stage 112 by the modulated power output 218 produced by the pulse width modulator 210. In one embodiment, the measured load current 226 is obtained from a current shunt 230, which is a low value resistor that is in line with the modulated power output 218. The voltage across the resistor 232 is indicative of the current to the testing stage 112. Other methods can also be employed to obtain the measured load current 226.

The target load current 228 indicates the desired maximum current that is to be supplied by the power stage 202 to the testing stage 112. Typically, the target load current 228 is set to a value based on the current limits of the power stage 202. In one embodiment, the target load current 228 is a voltage that indicates the desired maximum load current that is to be produced by the power stage 202.

Embodiments of the voltage control circuit 206 are configured to produce the voltage error output signal 222 that is dependent on whether the power stage 202 is in a voltage control mode or a current control mode. In one embodiment, the particular mode of operation of the power stage 202 is dependent on the difference between the measured load current 226 and the target load current 228. When the measured load current 226 is less than the target load current 228, the power stage 202 operates in the voltage control mode. When the measured load current 226 exceeds the target load current 228, the power stage 202 operates in the current control mode and clamps the current to the testing stage (i.e., power output 218) to a level that is equal to the target load current 228, in accordance with one embodiment of the invention.

When in the voltage control mode, the voltage error output signal 222 is based on a difference between a measured load voltage 234 and a target load voltage 236. The measured load voltage 234 is indicative of the voltage across the testing load 126 of the testing stage 112, and the target load voltage 236 is the voltage that is set to a value that is indicative of the desired voltage across the testing load 126.

In accordance with one embodiment, when the power stage 202 is in the current control mode, the voltage error output signal 222 is produced by the voltage control circuit based on the current error output signal 224 from the current control circuit 204. In one embodiment, the voltage error output signal 222 is produced by the voltage control circuit 206 based on the current error output signal 224 and the measured load voltage 234. Alternatively, the voltage error output signal 222 can be produced by the voltage control circuit 206 based on the current error output signal 224 and the target load voltage 236.

In one embodiment, the control input of the pulse width modulator controller 208 is coupled to the voltage error output signal 222 and produces the control signal 216 based on the voltage error output signal 222. Accordingly, the control signal 216 produced by the pulse width modulator controller 208 is based on a difference between the measured load voltage 234 and the target load voltage 236 when the power stage 202 is in the voltage control mode, and the control signal 216 produced by the pulse width modulator controller 208 is based on the current error output signal 224 from the current control circuit 204 when the power stage 202 is in the current control mode. Thus, the control signal 216 is based on the difference between the measured load current 226 and the target load current 228, when the power stage 202 is in the current control mode.

Figure 5:
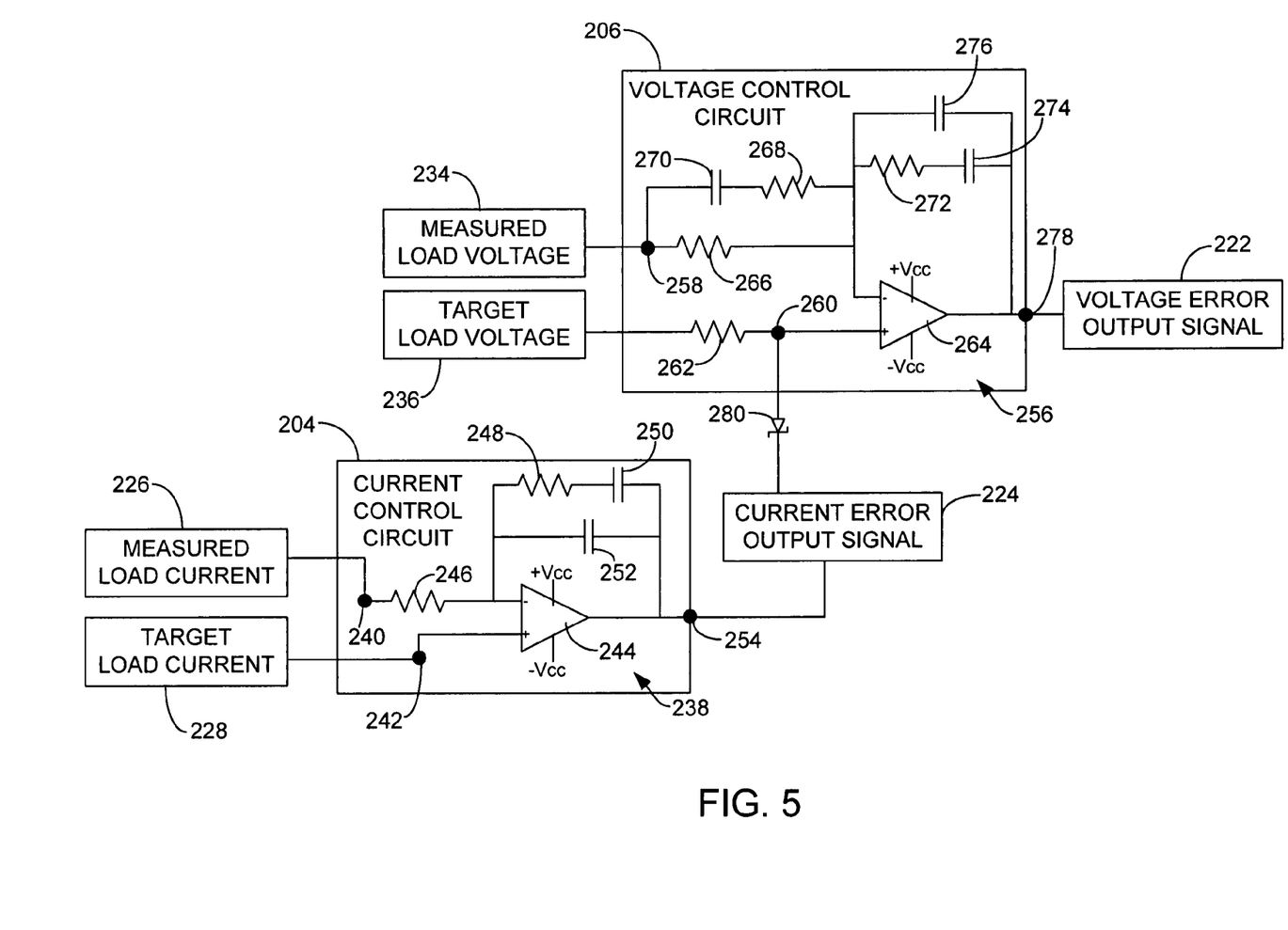
FIG. 5 is a circuit diagram of current and voltage control circuits of a power stage of a burn-in system in accordance with embodiments of the invention.

FIG. 5 illustrates exemplary current and voltage control circuits 204 and 206 of the power stage 202 in accordance with embodiments of the invention. Those skilled in the art understand that other current control circuit and voltage control circuit designs can be utilized and modifications can be made without departing from the spirit and scope of the invention. In addition to the overall designs of the current and voltage control circuits, the exemplary values of the resistors, capacitors and other elements of the circuits provided below can be set based on the desired application and performance of the circuits, as understood by those skilled in the art.

One exemplary embodiment of the current control circuit 204 comprises a current error amplifier 238 that includes a first input 240 that is coupled to the measured load current (a voltage) 226 and a second input 242 that is coupled to the target load current (a voltage) 228. The first input 240 of the current error amplifier 238 is coupled to the inverting input of an operational amplifier 244 through a resistor 246 (e.g., 3.57 k ohms), and the second input 242 of the current error amplifier 238 is coupled to the non-inverting input of the operational amplifier 244. The exemplary current error amplifier 238 includes alternating current (AC) coupled feedback between the output and the inverting input of the operational amplifier 244 that that includes resistor 248 (e.g., 10 k ohms) and capacitors 250 and 252 (e.g., 8200 pF and 820 pF).

The current error amplifier 238 generates the current error output signal (a voltage) 224 at the output 254 that will increase or decrease non-linearly with the difference between the voltages at the inverting and non-inverting inputs of the operational amplifier 244, which corresponds to the difference between the measured load current 226 and the target load current 228. Thus, the current error output signal 224 is indicative of the difference between the measured load current 226 and the target load current 228.

If the measured load current 226 at the first input 240 is less than the target load current 228 at the second input 242, the voltage of the current error output signal 224 will increase until the measured load current 226 and the target load current 228 substantially equalize, then maintain that level provided that the target load voltage has not been exceeded. Accordingly, while the measured load current 226 is less than the target load current 228, the voltage of the current error output signal 224 will remain at a "high" voltage level.

On the other hand, if the measured load current 226 at the first input 240 is greater than the target load current 228 at the second input 242, then the voltage of the current error output signal 224 will decrease until the measured load current 226 and the target load current 228 substantially equalize, then maintain that level. Thus, while the measured load current 226 exceeds the target load current 228, the voltage of the current error output signal 224 will remain at a "low" voltage level.

One exemplary embodiment of the voltage control circuit 206 includes a voltage error amplifier 256 that includes a first input 258 coupled to the measured load voltage 234 and a second input 260 coupled to the target load voltage 236 through a resistor 262 (e.g., 1.5 k ohms). The first input 258 of the voltage control circuit 206 is coupled to the inverting input of an operational amplifier 264 through a resistor 266 (e.g., 3.57 k ohms) and an AC coupled feedback that includes a resistor 268 (e.g., 390 ohms) and a capacitor 270 (e.g., 8200 pF). The second input 260 of the voltage control circuit 206 is coupled to the non-inverting input of the operational amplifier 264. The exemplary voltage error amplifier 256 includes AC coupled feedback between the output and the inverting input of the operational amplifier 264 that includes a resistor 272 (e.g., 4.12 k ohms), a capacitor 274 (8200 pF) and a capacitor 276 (e.g., 1000 pF).

The voltage error amplifier 256 generates the voltage error output signal (a voltage) 222 at an output 278 of the operational amplifier 264 that will increase or decrease non-linearly with the difference between the voltages at the inverting and non-inverting inputs of the operational amplifier 264. In general, if the voltage at the inverting input of the operational amplifier 264 is less than the voltage at the non-inverting input of the operational amplifier 264, the voltage error output signal 222 will increase until the voltages at the inverting and non-inverting inputs are balanced, then maintain that level. When the voltage at the inverting input of the amplifier 264 is greater than the voltage at the non-inverting input of the amplifier 264, the voltage error output signal 222 will be decreased until the voltages at the inverting and non-inverting inputs are balanced, then maintain that level.

As explained above, the voltage error output signal 222 is coupled to the pulse width modulator controller 208 (FIG. 4). The control signal 216 is generated based on the voltage error output signal 222 and determines the modulated power output 218 produced by the pulse width modulator 210.

One embodiment of the power stage 202 includes voltage and current control modes. The power stage 202 enters the voltage control mode when the measured load current 226 is less than the target load current 228, and the power stage 202 enters the current control mode when the measured load current 226 exceeds the target load current 228. In other words, when the load current to the testing stage 112 is within the operational limits of the power stage 202 (i.e., the power supply 214), the voltage error output signal 222 will be substantially based on the difference between the measured load voltage 234 at the first input 258 of the voltage control circuit 206 and the target load voltage 236 at the second input 260 of the voltage control circuit 206. However, when the measured load current 226 exceeds the target load current 228, the power stage 202 enters the current control mode and the voltage error output signal 222 is substantially based on the current error output signal 224.

In one embodiment, the current error output signal 224 is coupled to the second input 260 of the voltage control circuit 206 through a diode (e.g., Schottkey diode) 280, as shown in FIG. 5. The cathode of the diode 280 is coupled to the current error output signal 224 and the anode of the diode 280 is coupled to the non-inverting input of the operational amplifier 264 of the voltage control circuit.

When the power stage 202 is in the voltage control mode of operation (i.e., measured load current 226 is less than the target load current 228), the current error output signal 224 is at the "high" voltage level. The current control circuit 204 is designed such that this "high" voltage level causes the diode 280 to be reverse biased. As a result, the voltage at the non-inverting input of the operational amplifier 264 of the voltage control circuit 206 substantially corresponds to the target load voltage 236.

Thus, when the power stage 202 is in the voltage control mode, the voltage error output signal 222 will be substantially based on the difference between the measured load voltage 234 at the first input 258 and the target load voltage 236 at the second input 260. Additionally, when the power stage 202 is in the voltage control mode, the voltage error output signal 222 is substantially unaffected by changes in the current error output signal 224 that is at the "high" voltage level.

When the power stage 202 enters the current control mode of operation (i.e., the measured load current 226 exceeds the target load current 228), the current error output signal 224 is at the "low" voltage level. The current control circuit 204 is designed such that this "low" voltage level causes the diode 280 to be forward biased. As a result, the voltage at the non-inverting input of the operational amplifier 264 of the voltage control circuit 206 is lowered or pulled below the level set by the target load voltage 236 at the second input 260. Therefore, the voltage error output signal 222 will be based on a difference between the measured load voltage 234 and a voltage that is less than the target load voltage 236 when the power stage 202 is in the current control mode.

Thus, in accordance with one embodiment, when the power stage 202 is in the current control mode, the voltage error output signal 222 will be based on the current error output signal 224 and the measured load voltage 234. Accordingly, the voltage error output signal 222 will be affected by changes in the current error output signal 224.

Figure 6:
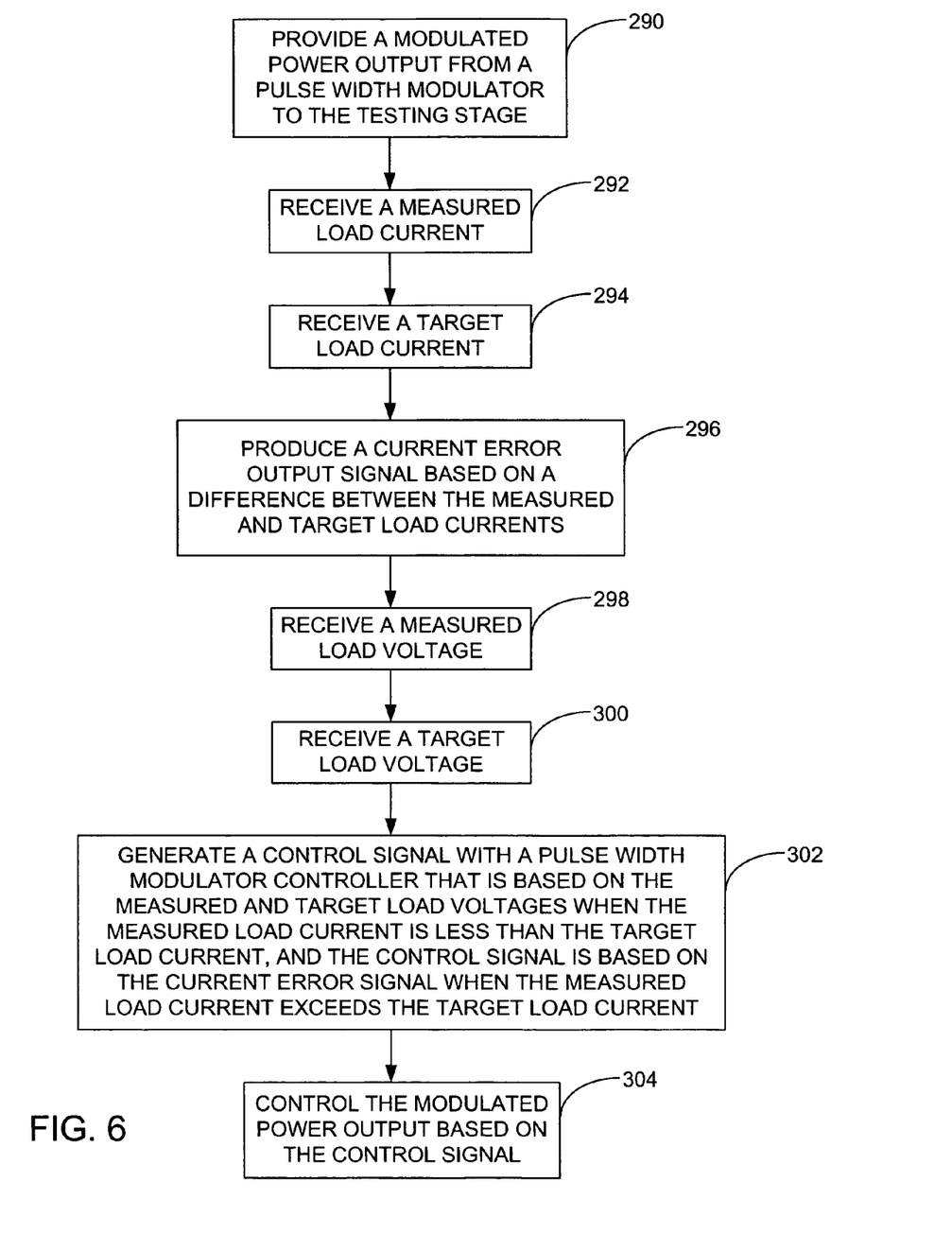
FIG. 6 is a flowchart illustrating a method of controlling power supplied to a testing stage of a burn-in system in accordance with embodiments of the invention.

FIG. 6 illustrates a method of operating the power stage 202 described above to control power supplied to the testing stage 112 of the burn-in system 200, in accordance with embodiments of the invention. At step 290, a modulated power output 218 is provided to a testing load 126 of the testing stage 112 from a pulse width modulator 210. A measured load current 226, which is indicative of a current supplied to the testing stage 112 by the modulated power output 218, is received at step 292, and a target load current 226 is received at step 294. Next, at step 296, a current error output signal 224 is produced based on a difference between the measured load current 226 and the target load current 228. A measured load voltage 234, which is indicative of a voltage across the load 126, and a target load voltage 236 are received at steps 298 and 300. At step 302, a control signal 216 is generated with a pulse width modulator controller 208 that is based on the measured load voltage 234 and the target load voltage 236 when the measured load current 226 is less than the target load current 228, and the control signal 216 is based on the current error output signal 224 when the measured load current 226 exceeds the target load current 228. Finally, at step 304, the modulated power output 218 is controlled based on the control signal 216.

In one embodiment of the method, the measured load voltage 234 is received at a first input 258 of a voltage control circuit 206 and the target load voltage 236 is received at a second input 260 of the voltage control circuit 206. Additionally, the current error output signal 224 is coupled to the first or second input of the voltage control circuit 206 and the voltage error output signal 222 is produced based on a voltage difference between the first and second inputs of the voltage control circuit 206. The control signal 216 is generated using the pulse width modulator controller 208 based on the voltage error output signal 222.

In accordance with another embodiment of the method, the current error output signal 224 is coupled to the second input 258 of the voltage control circuit 206. The voltage error output signal 222 is then produced by the voltage control circuit 206 such that it fluctuates based on changes in the voltage difference between the measured load voltage 234 and the target load voltage 236 when the measured load current 226 is less than the target load current 228, and the voltage error output signal 222 fluctuates based on changes in the current error output signal 224 when the measured load current 226 is greater than the target load current 228. In one embodiment, the voltage of the second input 260 of the voltage control circuit 206 is lowered below the target load voltage 236 using the current error output signal 224 when the measured load current 226 is greater than the target load current 228.

Thus, embodiments of the invention described above operate to control the modulated power output 218 produced by the pulse width modulator 210 based on the measured and target load voltages 234 and 236 to maintain a desired voltage across the testing load 126 when the power stage 202 is in the voltage control mode. Also, the control of the modulated power output 218 is substantially unaffected by the current error output signal 224 produced by the current control circuit 204 when the power stage 202 is in the voltage control mode. In the event that the current supplied to the testing stage 112 (measured load current 226) exceeds the set limit (target load current 228), the power stage 202 switches to the current control mode and the modulated power output 218 will decrease the power supplied to the testing stage 112 to reduce the current delivered to the testing stage 112 to a level that is generally equal to that indicated by the target load current 228. The decrease in the modulated power output 218 occurs in response to the affect the current error output signal 224 has on the voltage error output signal 222. The power stage 202 will switch from the current control mode back to the voltage control mode when the measured load current 226 drops below the target load current 228.

The switching of the power stage 202 between the voltage and current control modes allows for continuous, high power testing of the integrated circuit chips or electronic devices 106 (FIG. 2) of the testing stage 112 while protecting the power supply 214 and other components of the power stage 202 from excessive currents.

Additionally, the transitions between the voltage and current control modes are performed much more seamlessly than burn-in system power stages of the prior art. That is, the voltage control circuit 206 is less likely to produce errant voltage error output signals 222 during transitions between the voltage and current control modes. For example, the voltage control circuit 206 is less likely to produce a voltage error output signal 222 that rapidly fluctuates between the voltage rails ($+/-V_{cc}$) of the operational amplifier 264 during power stage 202 mode transitions.

As a result, the modulated power output 218 produced by the embodiments of the power stage 202 described above can be more accurately controlled and is less likely to include transients and other undesired characteristics during power stage mode transitions, unlike burn-in systems of the prior art. This results in more accurate testing of the integrated circuits. Additionally, the modulated power output 218 produced by the power stage 202 of the present invention is less likely to include undesired transient signals that could damage the integrated circuits being tested.

Although the present invention has been described with reference to preferred embodiments, workers skilled in the art will recognize that changes may be made in form and detail without departing from the spirit and scope of the invention.

What is claimed is:

1. A burn-in system for stress testing integrated circuits, the system comprising:
   a testing stage configured to stress test an integrated circuit; and
   a power stage comprising:
      a pulse width modulator configured to generate a modulated power output that is coupled to the testing stage;
      a current control circuit configured to produce a current error output signal that is based on a difference between a measured load current, which is indicative of the current that is supplied to the testing stage by the modulated power output, and target load current; and
      a voltage control circuit configured to produce a voltage error output signal that is based on a voltage difference between a first input that is coupled to a measured load voltage, which is indicative of the voltage across a load of the testing stage, and a second input that is coupled to a target load voltage and the current error output signal, wherein the modulated power output is based on the voltage error output signal.

2. The system of claim 1, wherein:
   the current control circuit comprises:
      a first input coupled to the measured load current; and
      a second input coupled to the target load current; and
   the current error output signal is indicative of a voltage difference between the first and second inputs of the current control circuit.

3. The system of claim 2, wherein:
   the current error output signal is coupled to the second input of the voltage control circuit; and
   the voltage error output signal is based on a voltage difference between the first input and the second input of the voltage control circuit.

4. The system of claim 3, wherein:
   the voltage control circuit further comprises an operational amplifier; and
   the second input of the voltage control circuit is coupled to an input to the operational amplifier.

5. The system of claim 3, wherein a voltage at the second input of the voltage control circuit changes in response to changes in the current error output signal when the measured load current is greater than the target load current.

6. The system of claim 5, wherein the current error output signal lowers the voltage at the second input of the voltage control circuit below the target load voltage when the measured load current is greater than the target load current.

7. The system of claim 6, wherein the voltage at the second input of the voltage control circuit is substantially unaffected by changes in the current error output signal when the measured load current is less than the target load current.

8. The system of claim 3, wherein the current error output signal is coupled to the second input of the voltage control circuit through a diode.

9. The system of claim 1, further comprising a pulse width modulator controller comprising a control signal based on the voltage error output signal, wherein the modulated power output is generated based on the control signal.

10. A burn-in system for stress testing integrated circuits, the system comprising:
   a testing stage configured to stress test an integrated circuit; and
   a power stage comprising:
      a pulse width modulator configured to generate a modulated power output that is coupled to the testing stage;
      a current control circuit comprising:
         a measured load current coupled to a first input, wherein the measured load current is indicative of a current supplied to the testing stage by the modulate power output;
         a target load current coupled to a second input; and a current error output signal that is generated based on a voltage difference between the first and second inputs; and a voltage control circuit comprising:
a measured load voltage coupled to a first input, wherein the measured load voltage is indicative of the load voltage that is being supplied to the testing stage;
a second input coupled to the current error output signal;
a target voltage coupled to the second input; and
a voltage error output signal that is generated based on a voltage difference between the first and second inputs of the voltage control circuit
wherein the modulated power output is generated based on the voltage error output signal.

11. The system of claim 10, further comprising a pulse width modulator controller configured to produce a control signal based on the voltage error output signal, wherein the modulated power output is generated based on the control signal.

12. The system of claim 10, wherein:
the voltage control circuit comprises an operational amplifier; and
the second input of the voltage control circuit is coupled to an input to the operational amplifier.

13. The system of claim 11, wherein a voltage at the second input of the voltage control circuit changes in response to changes in the current error output signal when the measured load current is greater than the target load current.

14. The system of claim 13, wherein the current error output signal lowers the voltage at the second input of the voltage control circuit below the target load voltage when the measured load current is greater than the target load current.

15. The system of claim 13, wherein the voltage at the second input of the voltage control circuit is substantially unaffected by changes in the current error output signal when the measured load current is less than the target load current.

16. The system of claim 11, wherein the current error output signal is coupled to the second input of the voltage control circuit through a diode.

17. In a burn-in system, a method of controlling power supplied to an integrated circuit testing stage comprising:
providing a modulated power output from a pulse width modulator to a load of the testing stage;
receiving a measured load current, which is indicative of a current supplied to the testing stage by the modulated power output;
receiving a target load current;
receiving a measured load voltage, which is indicative of a voltage across the load, at a first input of a voltage control circuit;
receiving a target load voltage at a second input of a voltage control circuit;
receiving a current error output signal, which is based on a difference between the measured load current and the target load current, at one of the first and second inputs of the voltage control circuit;
generating a voltage error output signal based on a voltage difference between the first and second inputs; and
controlling the modulated power output based on the voltage error output signal.

18. The method of claim 17, wherein:
receiving a current error output signal comprises receiving the current error output signal at the second input of the voltage control circuit; and
the voltage error output signal fluctuates based on changes in the voltage difference between the measured load voltage and the target load voltage when the measured load current is less than the target load current; and
the voltage error output signal fluctuates based on changes in the current error output signal when the measured load current is greater than the target load current.

19. The method of claim 18, further comprising lowering a voltage of the second input of the voltage control circuit below the target load voltage using the current error output signal when the measured load current is greater than the target load current.

* * * * *